United States Patent [19]
Araki et al.

[11] Patent Number: 5,397,956
[45] Date of Patent: Mar. 14, 1995

[54] ELECTRON BEAM EXCITED PLASMA SYSTEM

[75] Inventors: Yoh-ichi Araki, Nirasaki; Shuuji Mochizuki, Kofu, both of Japan

[73] Assignee: Tokyo Electron Limited, Tokyo, Japan

[21] Appl. No.: 4,066

[22] Filed: Jan. 13, 1993

[30] Foreign Application Priority Data

Jan. 13, 1992 [JP] Japan .................. 4-024783
Feb. 19, 1992 [JP] Japan .................. 4-032328
Feb. 19, 1992 [JP] Japan .................. 4-032329

[51] Int. Cl.$^6$ ............... H01J 17/26; H01J 27/20
[52] U.S. Cl. .............. 313/231.37; 315/111.61; 315/111.81
[58] Field of Search ........... 313/362.1, 231.31; 315/111.21, 111.41, 111.61, 111.81

[56] References Cited

U.S. PATENT DOCUMENTS

| | | | |
|---|---|---|---|
| 3,329,864 | 7/1967 | Michel et al. | 315/111.61 |
| 4,742,232 | 5/1988 | Biddle et al. | 315/111.81 X |
| 4,782,235 | 11/1988 | Lejeune et al. | 315/111.81 X |

FOREIGN PATENT DOCUMENTS

| | | |
|---|---|---|
| 64-53422 | 3/1989 | Japan . |
| 1-105539 | 4/1989 | Japan . |
| 1-105540 | 4/1989 | Japan . |
| 5136067 | 6/1993 | Japan ........... 315/111.61 |

*Primary Examiner*—Sandra L. O'Shea
*Attorney, Agent, or Firm*—Oblon, Spivak, McClelland, Maier & Neustadt

[57] ABSTRACT

An electron beam excited plasma system in which an electron beam is extracted from a discharge plasma and accelerated, the accelerated electrons are applied to a etching gas to convert the etching gas into plasma, and the resulting gas plasma is caused to act on a wafer. The system comprises first gas source for supplying a gas for the generation of the discharge plasma to the region between a cathode and an anode, a first solenoid for forming a magnetic field substantially parallel to the direction of the electron beam such that the electron beam is guided along a center line connecting an axis of the cathode and a central axis of the wafer, an accelerating electrode surrounded by the first solenoid and adapted to accelerate the electron beam when a voltage is applied between the accelerating electrode and the anode, a second solenoid opposed to the wafer and scattering the magnetic field, formed by the first solenoid, outward from the center line, a double third solenoid for drawing in the magnetic field, scattered by the second solenoid, to a periphery of the wafer, a second gas source for supplying the etching gas to be converted into plasma by means of the electron beam to a region around the wafer, and a vacuum pump for evacuating the region around the wafer.

20 Claims, 18 Drawing Sheets

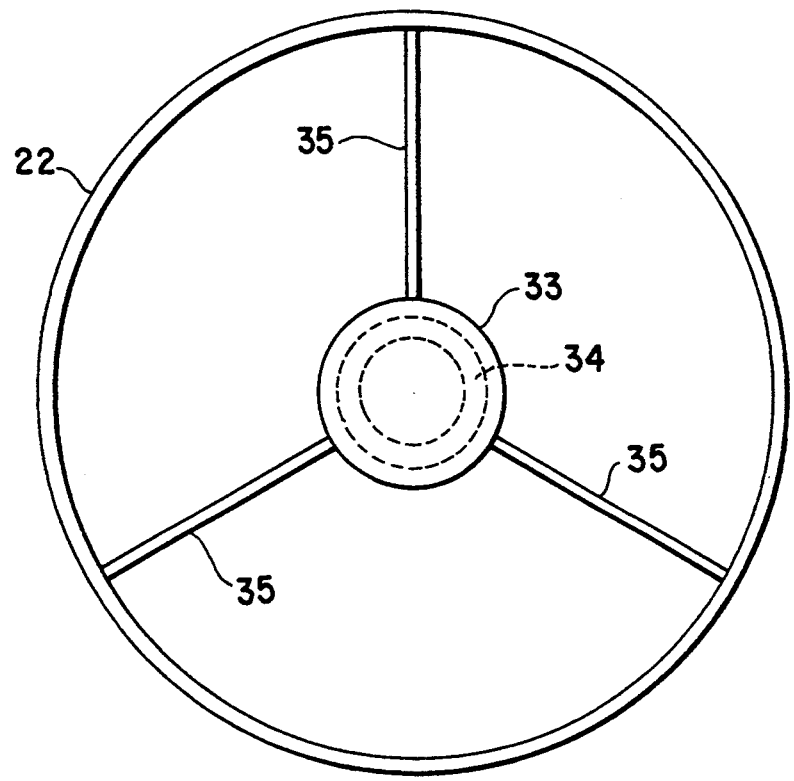
FIG. 4
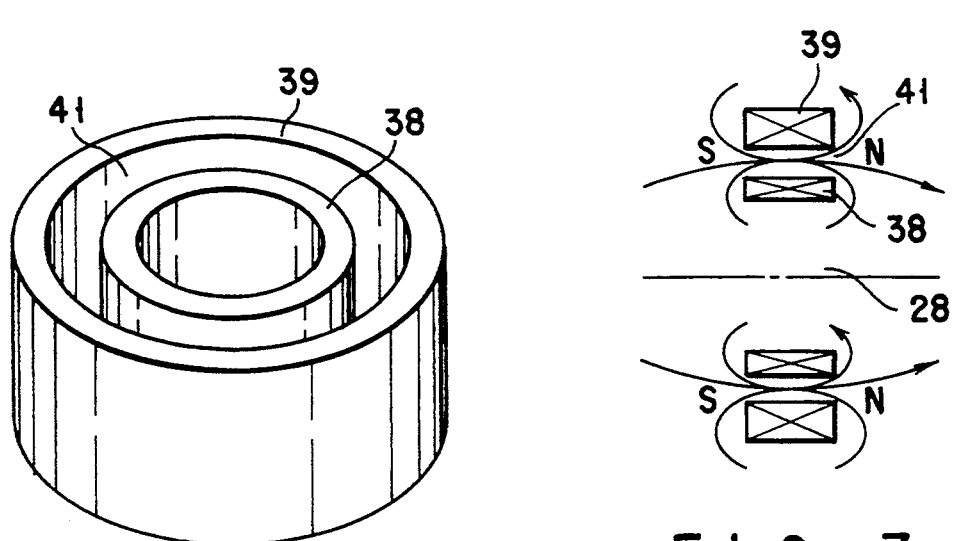
FIG. 5
FIG. 7

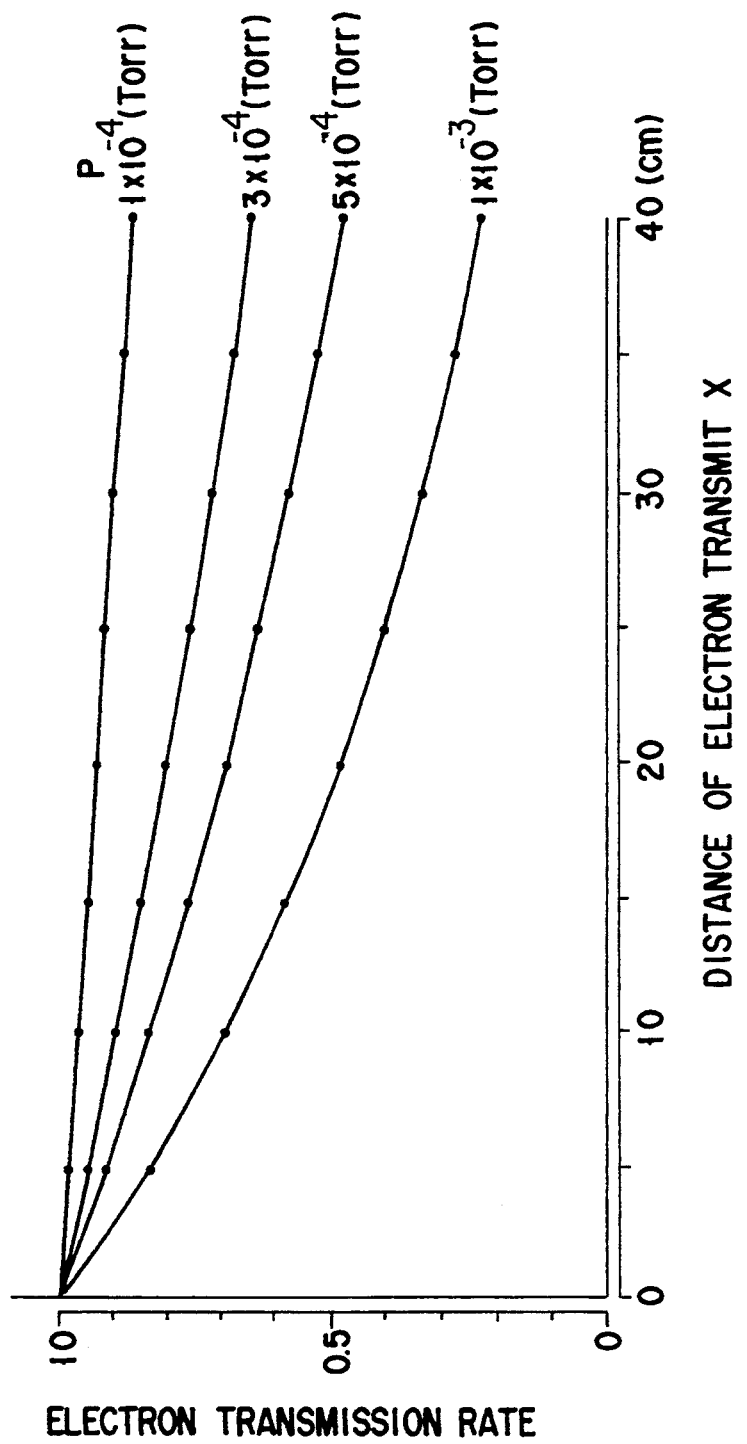
F I G. 14

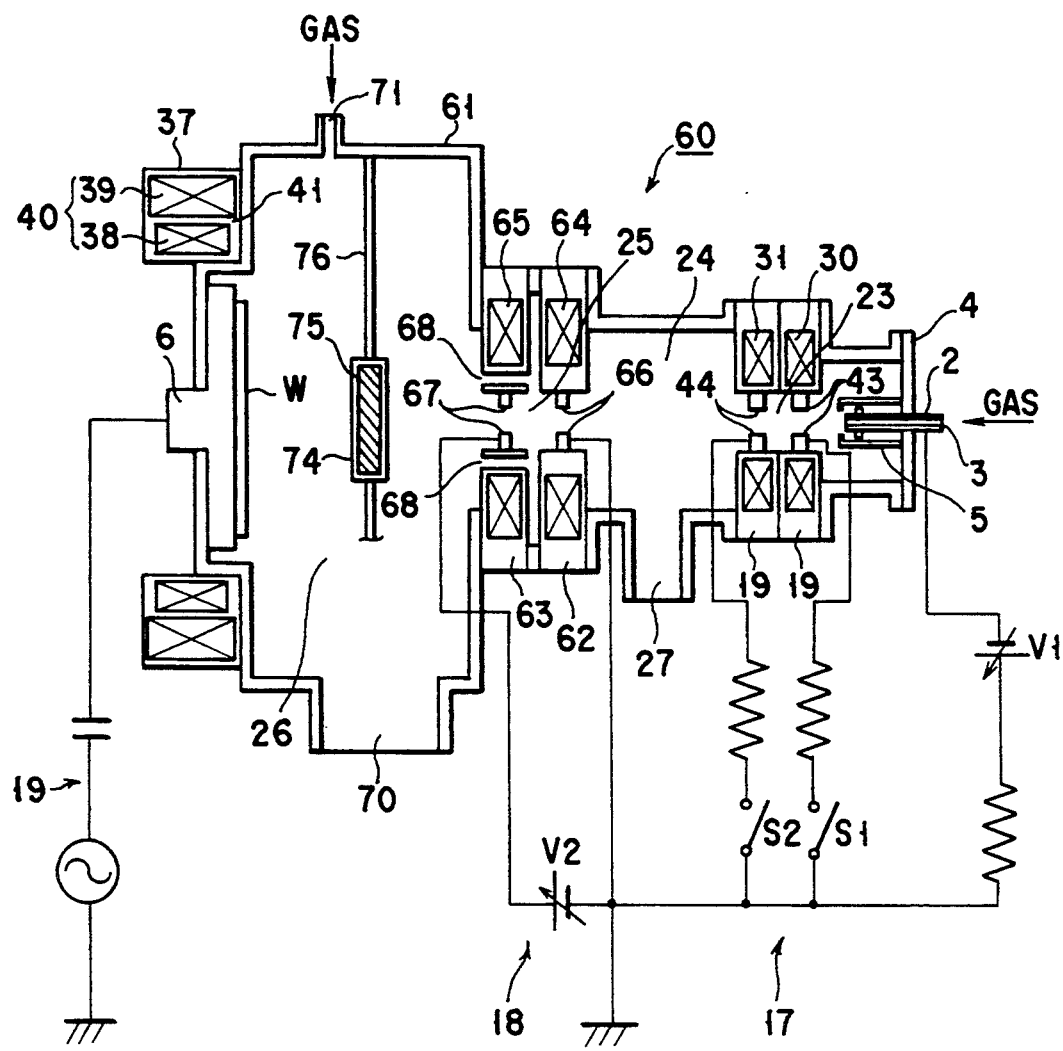
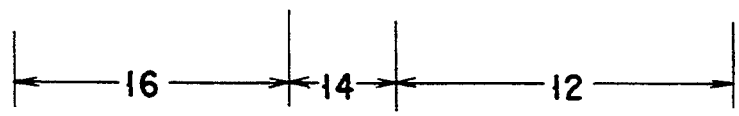
F I G. 15

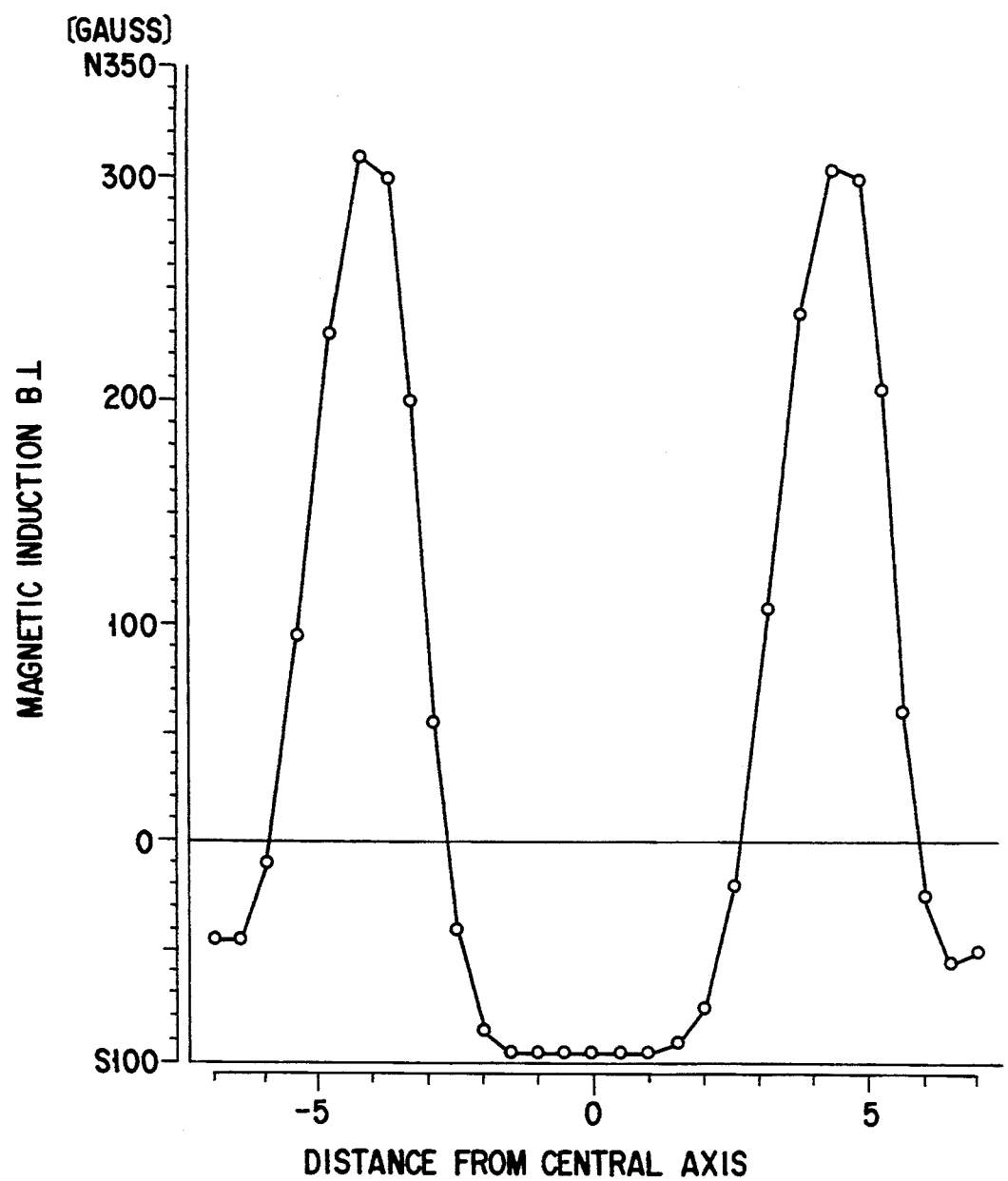
F I G. 18

ELECTRON BEAM EXCITED PLASMA SYSTEM

BACKGROUND OF THE INVENTION

1. Field of the Invention

The present invention relates to an electron beam excited plasma system used for the manufacture of semiconductor devices and the like.

2. Description of the Related Art

In an electron beam excited plasma system, a reaction gas is excited by means of an electron beam to generate plasma, and etching or film formation is effected by causing the resulting plasma to act on a semiconductor wafer.

In this system, the plasma as electron beam source is formed by DC discharge, and electrons are extracted from the plasma, accelerated, and introduced into a region in which a specific reaction gas is stored as an ambient gas, The reaction gas is activated by means of the electron beam, whereby high-density plasma is generated. In this system, moreover, a magnetic field is formed along the advancing direction of the electron beam, and the beam is guided by means of this magnetic field.

Described in Published Unexamined Japanese Patent Application No. 64-53422 is a plasma system of a type such that an electric discharge gas is converted into plasma, and electrons extracted from the plasma are accelerated and applied to an etching gas. Disclosed in Published Unexamined Japanese Patent Application NO. 1-105540, moreover, is a plasma system of a type such that an inverse-magnetic field coil is used to cancel a magnetic field which is formed in a region for the conversion of reaction gas into plasma. Disclosed in Published Unexamined Japanese Patent Application No. 1-105539, furthermore, is a plasma system of a type such that an electric field is arranged in order to deflect and diffuse electrons which are introduced into a region for the conversion of reaction gas into plasma.

In the plasma systems of these conventional types, however, the distance between the respective centers of solenoids in an acceleration chamber is adjusted to several hundreds of millimeters, and the bore of an exhaust port which can be set in the acceleration chamber is restricted to 100 mm with respect to the moving direction of the electrons and 200 mm with respect to a direction perpendicular to the electron moving direction, in order that magnetic lines of force, formed by means of the solenoids, define an optimum space for the acceleration of the electrons. Thus, the bore of the exhaust port is so small for the capacity of the acceleration chamber that the exhaust efficiency of a vacuum unit is lowered.

A reaction chamber, which adjoins the acceleration chamber, is kept at an inner pressure of $10^{-5}$ to $10^{-3}$ torrs. In order to keep the inside of the acceleration chamber at a degree of vacuum substantially equal to that of the reaction chamber, e.g., at about $3 \times 10^{-4}$ torrs, therefore, evacuation of the acceleration chamber takes a lot of time.

In the worst case, an exhaust efficiency of the acceleration chamber decreases, and as a result, corrosive reaction gas produced in the reaction chamber may possibly be introduced into a plasma generating chamber via the acceleration chamber.

There may be provided an alternative arrangement such that an acceleration chamber and a vacuum unit, which communicates with an exhaust port of the acceleration chamber, are formed of a corrosion-resistant material, the acceleration chamber is elongated in the electron moving direction, and the bore of the exhaust port is increased, in order to prevent corrosive reaction gas from entering a plasma generating chamber which adjoins the acceleration chamber. If the acceleration chamber is made longer with respect to the the electron moving direction, however, the distance of electron transit increases, so that the systems are large-sized. Thus, solenoids surrounding an anode and accelerating electrodes must be increased in diameter in order that magnetic lines of force, formed by means of the solenoids, define an optimum space for the acceleration of the electrons. Accordingly, the conventional type plasma systems are large-sized.

In manufacturing semiconductor devices, it is necessary to secure a uniform processing rate (etching rate or film forming rate) within the plane of an object of processing as one of processing characteristics. Since the diameter of modern semiconductor wafers tends to increase from 6 inches to 8 or 12 inches, in particular, the plasma systems are expected to ensure a uniform processing rate for a wider region. According to the conventional systems, however, high-energy electrons concentrate upon the central region of each semiconductor wafer, so that the processing rate takes one value for the central region and another for the peripheral region.

SUMMARY OF THE INVENTION

An object of the present invention is to provide an electron beam excited plasma system which is small-sized and in which corrosive reaction gas can be prevented from entering a plasma generating chamber.

Another object of the invention is to provide an electron beam excited plasma system capable of ensuring a high-density uniform processing rate for semiconductor wafers.

According to an aspect of the present invention, there is provided an electron beam excited plasma system in which an electron beam is extracted from discharge plasma and accelerated, the accelerated electrons are applied to a process gas to convert the process gas into a gas plasma, and the resulting gas plasma is caused to act on a semiconductor water, which comprises first gas supply means for supplying a gas, for the generation of the discharge plasma, to a region between a cathode and an anode, first magnetic field forming means for forming a first magnetic field substantially parallel to the direction of the electron beam such that the electron beam is guided along a center line connecting a axis of the cathode and an central axis of the wafer, an accelerating electrode surrounded by the first magnetic field forming means and adapted to accelerate the electron beam when a voltage is applied between the accelerating electrodes and the anode, second magnetic field forming means opposed to the wafer and scattering a second magnetic field, formed by means of the first magnetic field forming means, outward from the center line, and third magnetic field forming means for drawing in a third magnetic field, scattered by means of the second magnetic field forming means, to a peripheral portion wafer, second gas supply means for supplying the process gas to be converted into the gas plasma by the electron beam to a region around the wafer, and exhaust means for evacuating the region around the wafer.

According to the present invention, the electron beam is guided along the center line, which connects the cathode axis and the central axis of the object of processing, by means of the magnetic field which is formed by means of the first magnetic field forming means. Also, the electron beam is scattered outward from the center line by means of the magnetic field which is formed by means of the second magnetic field generating means. Further, the scattered electron beam is drawn in to the periphery of the object of processing by means of the magnetic field which is formed by means of the third magnetic field forming means. Thus, the electron beam, scattered in the diametrical direction, is guided so as to be drawn toward the periphery of the object of processing without emanating. As a result, an axially symmetrical outline of magnetic field is formed by plasma ionized in the path of high-energy electrons, and a region of very low magnetic field intensity is defined inside the outline of magnetic field. Accordingly, there exists uniform plasma which is bound less firmly to the magnetic field.

Since the scattered magnetic field is confined to the specific region by means of the third magnetic field forming means, moreover, high-density plasma can be secured. Thus, a uniform plasma density can be obtained inside the axially symmetrical outside magnetic field of high intensity, and the uniformity of the processing rate of the object of processing, which is situated opposite to the magnetic field, is improved.

Preferably, in order to obtain a more uniform plasma density, fourth magnetic field forming means is used to cancel the magnetic field (in the direction identical with or opposite to the advancing direction of the electrons) which is formed by means of a ring shape permanent magnet as the third magnetic field forming means.

According to another aspect of the present invention, there is provided an electron beam excited plasma system in which electrons are extracted from discharge plasma and accelerated, the accelerated electrons are applied to a process gas to convert the process gas into plasma, and the resulting gas plasma is caused to act on a semiconductor wafer, which comprises a plasma generating chamber having a cathode and an anode for generating the discharge plasma, a reaction chamber in which the process gas is converted into plasma for wafer processing by applying the electrons extracted from the discharge plasma, a coupling portion located between the plasma generating chamber and the reaction chamber, an electron beam accelerating electrode located between the coupling portion and the reaction chamber and having a center hole through which the electrons pass, and a plurality of communication passages formed in the electron beam accelerating electrode so as to surround the center hole and communicating with the reaction chamber and the coupling portion.

According to the system of the present invention, the reaction chamber is divided from the coupling portion by means of the electron beam accelerating electrode, and the coupling portion is not provided with any exhaust passage. Since neutral particles (gas molecules, etc.) flow from the reaction chamber to the coupling portion through the communication passages, however, the coupling portion can be kept substantially at the same degree of vacuum as the reaction chamber. Since the communication passages are arranged around the center hole, moreover, the electron beam can be efficiently introduced into the reaction chamber through the center hole. Thus, the coupling portion requires no exhaust port, so that the number of components of the system and hence, the system size, can be reduced.

Preferably, moreover, the anode and the electron beam accelerating electrode at the coupling portion are backed up by magnetic field generating means (solenoid). To attain this, the coupling portion is short with respect to the moving direction of the electrons, so that the electrons can be efficiently extracted from the discharge gas plasma from the plasma generating chamber, accelerated, and introduced into the reaction chamber, thereby converting the reaction gas into plasma. Furthermore, the coupling portion, which has a small capacity, can be fully evacuated by means of a vacuum unit which is connected to the reaction chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a diagram showing a scattering electromagnet according to the first embodiment;

FIG. 5 is a perspective view showing a lead-in double electromagnet according to the first embodiment;

FIG. 7 is a model diagram showing lead-in magnetic lines of force according to the first embodiment;

FIG. 14 is a graph illustrating the relationships between the distance of electron transit and electron transmission rate obtained with use of varied chamber internal pressures;

FIG. 15 is a vertical sectional view showing an outline of an electron beam excited plasma system according to a second embodiment;

FIG. 18 shows a magnetic field intensity distribution curve according to a comparative system;

DETAILED DESCRIPTION OF THE PREFERRED EMBODIMENTS

Various embodiments of the present invention will now be described in detail with reference to the accompanying drawings.

Figure 1:
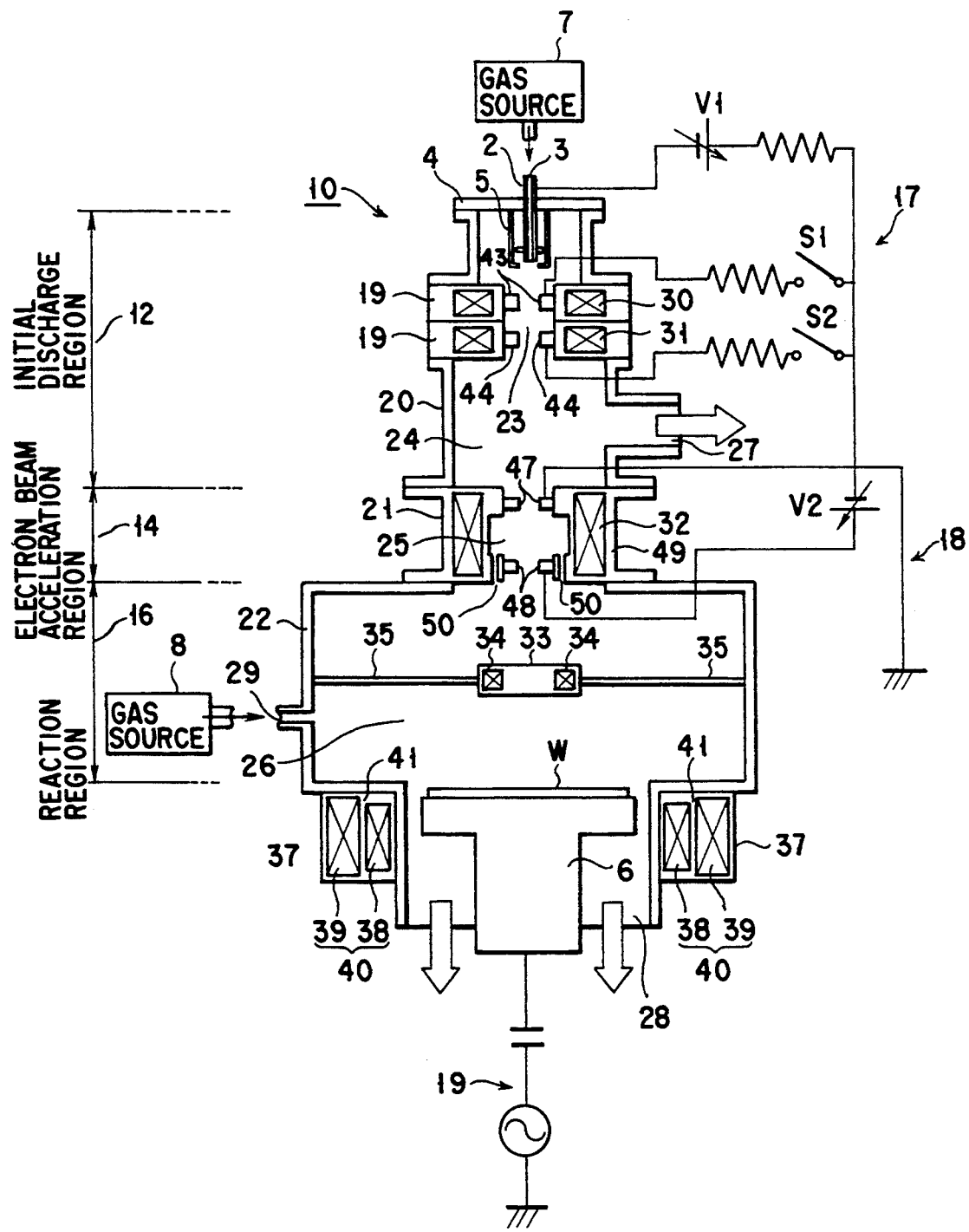
FIG. 1 is a vertical sectional view showing an outline of an electron beam excited plasma system according to a first embodiment of the present invention.

As shown in FIG. 1, an electron beam excited plasma system 10 according to a first embodiment is a vertical-type dry etching apparatus which comprises an initial discharge region 12, an acceleration region 14, and a reaction region 16. This vertical-type dry etching apparatus 10 has the initial discharge region 12 between a cathode 2 and an anode 47, the electron beam acceleration region 14 between the anode 47 and an electron beam accelerating electrode 48, and the reaction region (etching region) 16 between the electrode 48 and a wafer holder 6.

A stainless-steel cylinder unit 20 is provided with two intermediate electrodes 43 and 44, which are arranged in the initial discharge region 12. The electrodes 43 and 44 are backed up (surrounded) by solenoids 30 and 31, respectively, which are connected to a DC power source (not shown). Also, the intermediate electrodes 43 and 44 are connected to a plasma discharge circuit 17 via switches S1 and S2, respectively. A voltage $V_1$ from a variable DC power source is applied to the circuit 17. The intermediate electrodes 43 and 44 serve to assist the cathode 2 and the anode 47 so that initial discharge between them is stabilized. After the initial discharge is stabilized, therefore, the switches S1 and S2 are turned off. The solenoids 30 and 31 are used to form a discharge magnetic field (first magnetic field).

An exhaust passage 27 is formed at a suitable portion of the cylinder unit 20, and the initial discharge region 12 is exhausted to a high vacuum through the passage 27. A cover 4 is put on a top opening of the unit 20. The hollow cathode 2 penetrates the cover 4 so that its distal end is exposed to the inside of the initial discharge region 12. The distal end portion of the cathode 2 is protected by means of a protector cylinder 5.

An internal passage 3 of the cathode 2 communicates with an argon gas source 7. Argon gas, which is a gas for plasma discharge, is supplied to spaces 23 and 24. Thus, when the discharge voltage $V_1$ of the circuit 17 is applied between the cathode 2 and the anode 47, electric discharge is caused to convert the argon gas into plasma. Some other inert gas, such as helium gas, may be used in place of the argon gas as the initial discharge gas.

A stainless-steel cylinder unit 21 is provided with the anode 47 and the accelerating electrode 48, which are arranged in the electron beam acceleration region. The anode 47 and the accelerating electrode 48, which are surrounded by one solenoid 32, are connected to an electron accelerator circuit 18. A voltage $V_2$ from a variable DC power source is applied to the circuit 18. The voltage $V_2$ is applied between the electrodes 47 and 48, as a result electrons extracted from plasma are accelerated.

Figure 2:
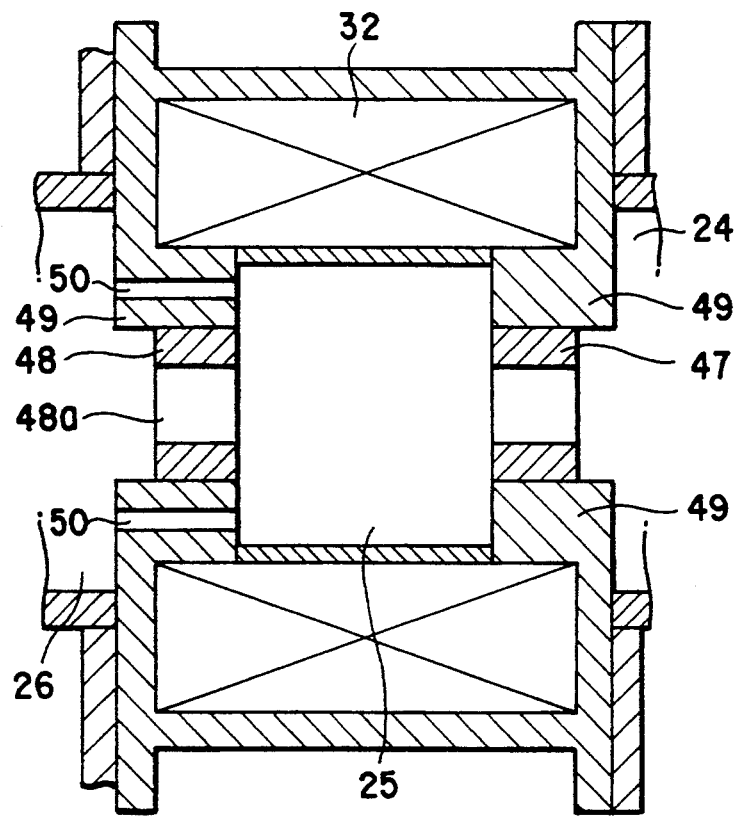
FIG. 2 is a partial sectional view showing an acceleration region of the system according to the first embodiment.

As shown in FIG. 2, the anode 47 and the accelerating electrode 48 are supported by means of a holder 49. An electron beam acceleration space 25 and a reaction space 26 communicate with each other by means of a plurality of small passages 50, which are formed in the holder 49. The diameter and number of the small passages 50 are determined so that neutral particles (ions) can freely pass through the passages 50. Preferably, each diameter of the passage 50 is within a range from 3.0 to 4.0 mm, and the number of the passages 50 is from 6 to 10. While the accelerated electrons proceed from the space 25 to the space 26 through a center passage 48a, the neutral particles (ions), on the other hand, proceed from the space 26 to the space 25 through the small passages 50. The neutral particles (ions), moving through the passages 50 in this manner, never prevent the flow of the accelerated electrons. The difference between the respective internal pressures of the spaces 25 and 26 is automatically adjusted by the agency of the small passages 50.

Figure 3:
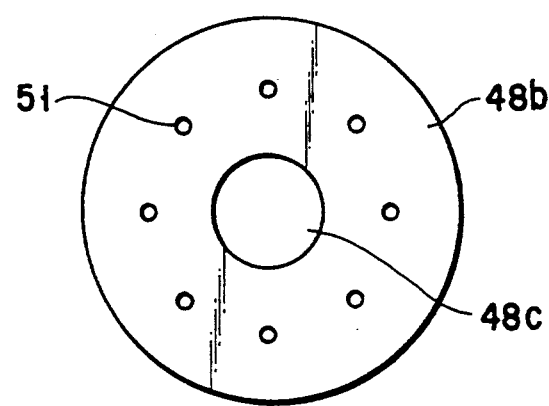
FIG. 3 is a diagram showing a modification of an accelerating electrode.

As shown in FIG. 3, small passages 51 may be formed directly in an accelerating electrode 48b which has a center passage 48c.

The electrodes 43, 44, 47 and 48 are arranged coaxial with one another, surrounding an electron passage (center area of cylinder). The electrodes 43, 44, 47 and 48 and the solenoids 30, 31 and 32 are retained by means of their corresponding holders 19 and 21a.

A center hole in the anode 47 has a diameter of 8 mm and length of 20 mm. A center hole in the electron beam accelerating electrode 48 has a diameter of 10 mm and length of 20 mm. The outside diameter of the solenoid 32 in the electron beam acceleration region 14 is 245 mm, and a magnetic field of about 400 gauss be able to be generated by means of the solenoid 32.

A cylinder unit 22 is provided with the wafer holder 6 and a scattering magnetic coil 34, which are arranged in the reaction region 16. A semiconductor wafer W is placed on the top surface of the holder 6, which is opposed to the cathode 2. The wafer holder 6 includes a retaining mechanism (not shown) for immovably holding the wafer W. An RF circuit 19 is connected to the holder 6. An exhaust passage 28 is formed in the center of the lower portion of the cylinder unit 22. The passage 28 communicates with a suction port of a vacuum pump (not shown). The wafer holder 6 is inserted in the passage 28.

As shown in FIG. 4, the scattering magnetic coil 34 is disposed in a unit holder 33. The unit holder 33 is supported in the cylinder unit 22 by means of three support bars 35 in a manner such that the magnetic coil 34 is located in the central region of the space 26. The coil 34 forms a magnetic field (second magnetic field) for scattering the accelerated electrons from the central region to the peripheral region of the space 26.

A gas passage 29 is formed in the peripheral wall portion of the cylinder unit 22. The passage 29 communicates with an etching gas source 8, which is stored with $SF_6$, $Cl_2$, $O_2$, or argon gas.

A double electromagnet 40 is provided surrounding the wafer W on the holder 6. The double electromagent 40, which consists of coaxial inner and outer solenoids 38 and 39, is held under the cylinder unit 22 by means of a holder 37. The double electromagnet 40 forms a magnetic field (third magnetic field) for drawing in the electrons scattered in the second magnetic field toward the wafer W.

As shown in FIG. 5, a uniform gap (magnetic gap) 41 is formed between the inner and outer solenoids 38 and 39. The solenoids 38 and 39 are connected individually to separate power sources (not shown), and the current supply to each solenoid is controllable. The diameter of the inner solenoid 38 is equal to or smaller than that of the outer solenoid 39.

Figure 6:
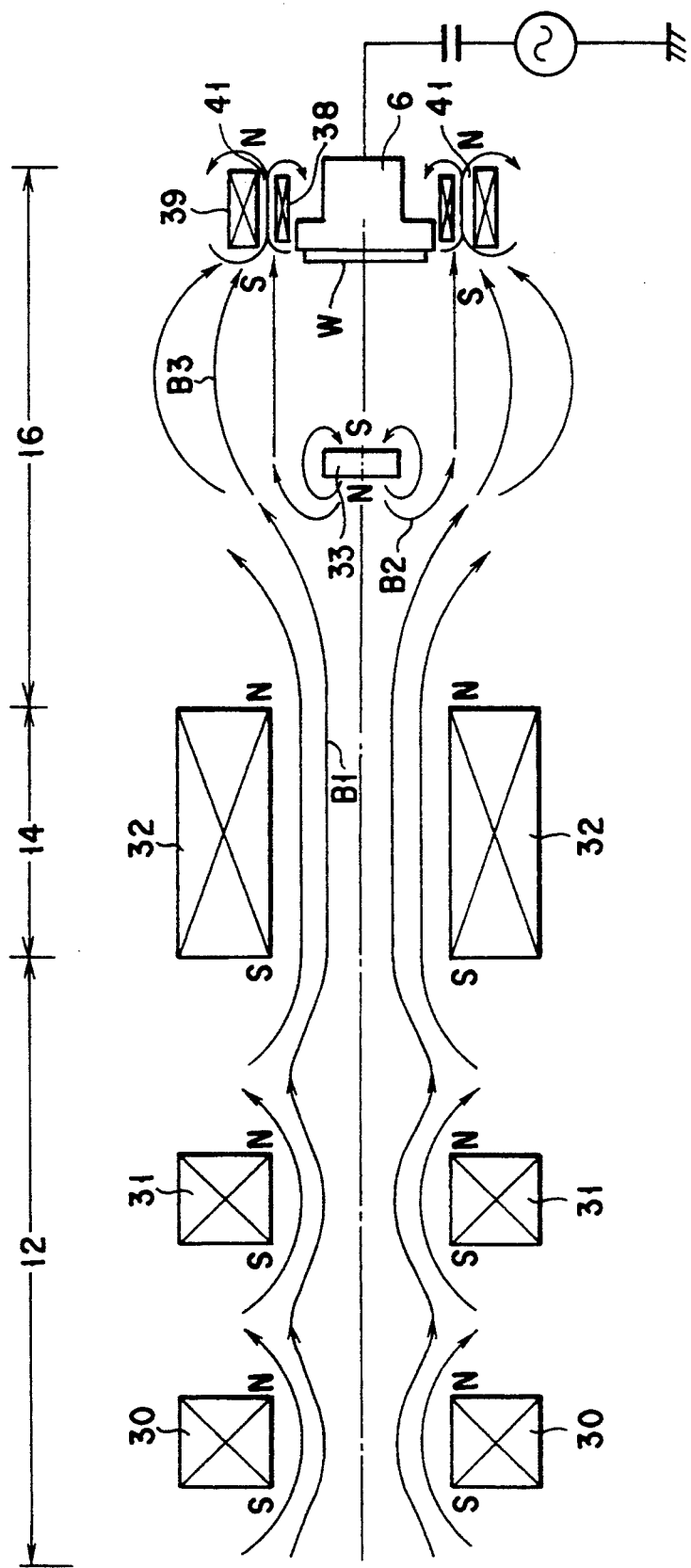
FIG. 6 is a model diagram showing magnetic lines of force in the whole system according to the first embodiment.

Referring now to FIGS. 6 and 7, the distribution of magnetic force lines in the electron beam acceleration region 14 and the etching region 16 will be described.

In the initial discharge region 12, a magnetic field is formed by means of the solenoids 30 and 31. In the acceleration region 14, moreover, a magnetic field is formed by means of the solenoid 32. The first magnetic fields are formed along the advancing direction of the electrons. More specifically, a magnetic line of force $B_1$ is formed when the respective south and north poles of these magnetic fields, which are formed by means of the solenoids 30, 31 and 32, are put in order as illustrated. The electron beam is guided toward the wafer W by means of the magnetic line of force $B_1$.

In the etching region 16, moreover, the second magnetic field (magnetic line of force $B_2$) is formed by means of the solenoid 34. The polarity of the second magnetic field is opposite to that of the first magnetic field. High-energy electrons are guided along the central axis by means of the magnetic line of force $B_1$, and are then scattered toward the peripheral portion by means of the magnetic line of force $B_2$.

Figure 10:
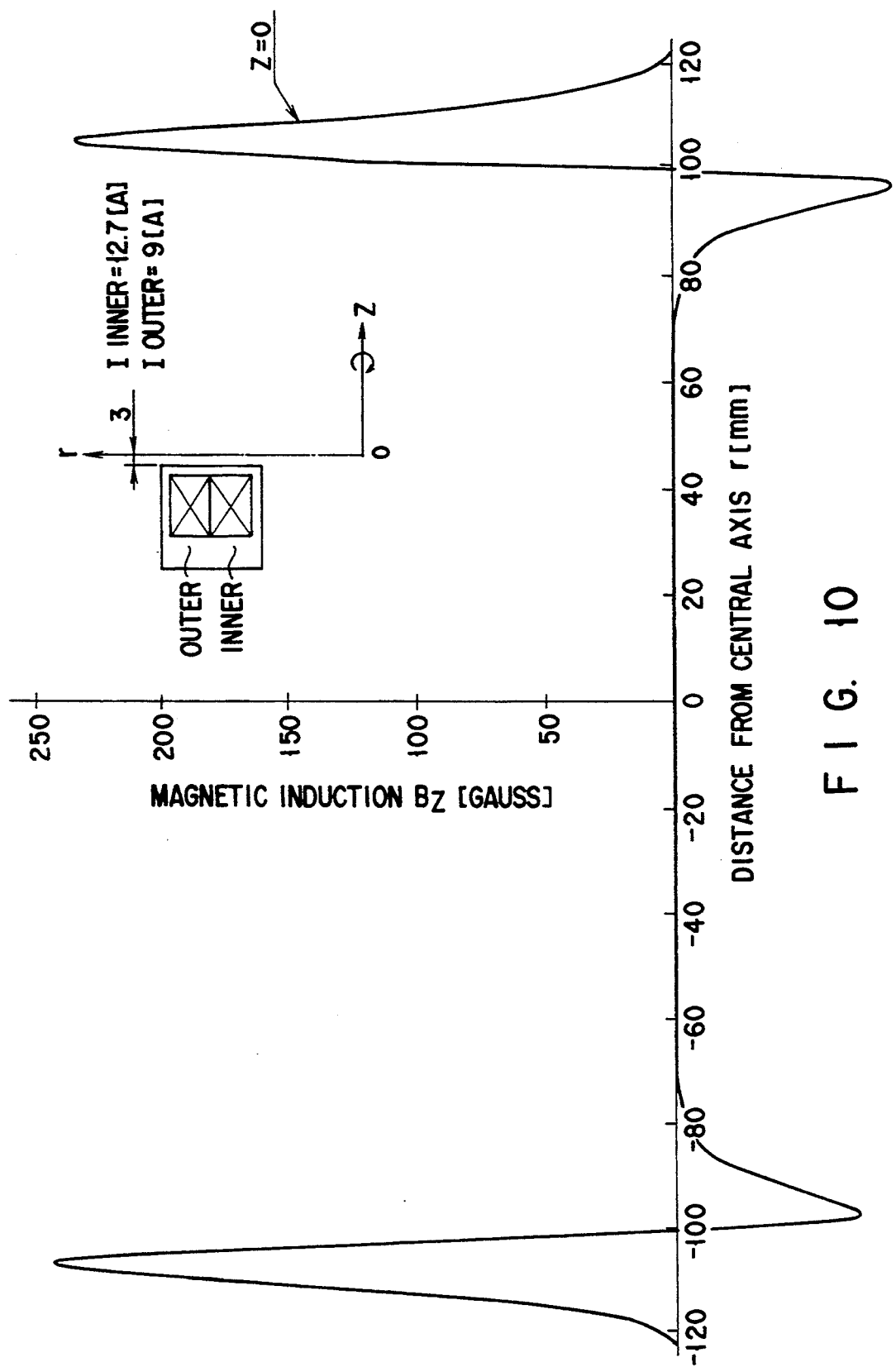
FIG. 10 shows a distribution curve representing the magnetic induction on an end face of a solenoid holder.
Figure 11:
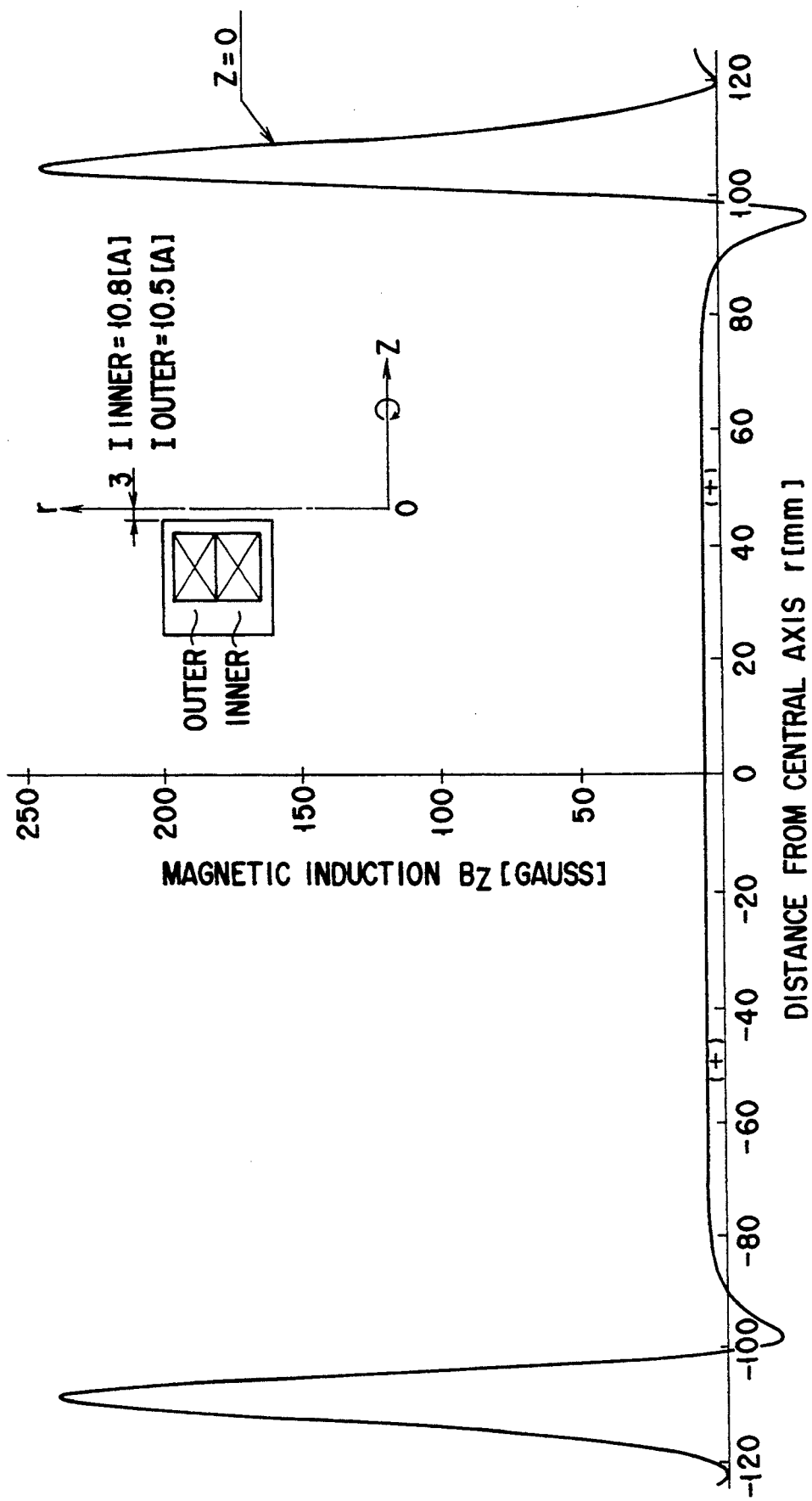
FIG. 11 shows a distribution curve representing the magnetic induction on the end face of the solenoid holder obtained with use of different amounts of current supply.

When the third magnetic field is formed by means of the inner and outer solenoids 38 and 39, as shown in FIG. 7, a lead-in magnetic line of force $B_3$ is formed as illustrated. The polarity of the third magnetic field is identical with that of the first magnetic field. The third magnetic field serves to draw the electrons into the gap 41 between the solenoids 38 and 39. Thus, the two coaxial electromagnets 38 and 39 act so as to cancel the magnetic field in their inside area. As a result, the magnetic induction is reduced to zero (no magnetic field) within the radial range of 70 to 90 mm from the central axis, as indicated by the characteristic curves of FIGS. 10 and 11, so that a substantially uniform magnetic field is formed over the whole surface of the wafer W. The conditions for the results shown in FIG. 10 are measured on an end face of the solenoid holder 37 with the amounts of current supply to the inner and outer solenoids 38, 29 adjusted to 12.7 A and 9 A, respectively. The conditions for the results shown in FIG. 11 are measured on the end face of the holder 37 with the amounts of current supply to the inner and outer solenoids 38, 39 adjusted to 10.8 A and 10.5 A, respectively.

The scattered electrons are drawn along the magnetic line of force $B_3$ into the gap 41. Accordingly, the high-energy electrons can reach the peripheral portion of the wafer W. As a result, a cylindrical region of high magnetic field intensity is formed around the wafer W, and the plasma is confined to this region.

The size of an electron inlet port of the first intermediate electrode 43 can be freely selected. The internal pressure of the spaces 23 and 24, ranging from the intermediate electrode 43 to the anode 47, is adjustable so that the first discharge gas conversion into plasma can be effected with high efficiency. The solenoids 30 and 31 are wound so as to surround the first and second intermediate electrodes 43 and 44, respectively. In this case, the electrode 43 is 3 mm in diameter and 15 mm in length, while the electrode 44 is 15 mm in diameter and 60 mm in length. The magnetic field formed by the solenoid 31 of the second intermediate electrode 44 has the intensity of 300 gauss. O-rings (not shown) are inserted individually in reciprocal joints between the cylinder units 20, 21 and 22, whereby the cylinder units can be kept airtight inside.

The following is a description of the magnetic field intensity and internal pressure at each part of the system.

The magnetic field intensity and internal pressure were measured around the central axis of the system. The magnetic field intensity was 400 gauss around the first intermediate electrode 43, 300 gauss around the second intermediate electrode 44, 400 gauss around the anode 47 and the accelerating electrode 48, 90 gauss around the scattering coil 34, 200 gauss at the peripheral portion of the wafer W, and 2 to 18 gauss at the central portion of the wafer W. Further, the internal pressure was 1 torr in the space 23, 6 millitorrs in the space 24, 0.3 millitorr in the space 25, and 0.5 millitorr in the space 26.

Figure 8:
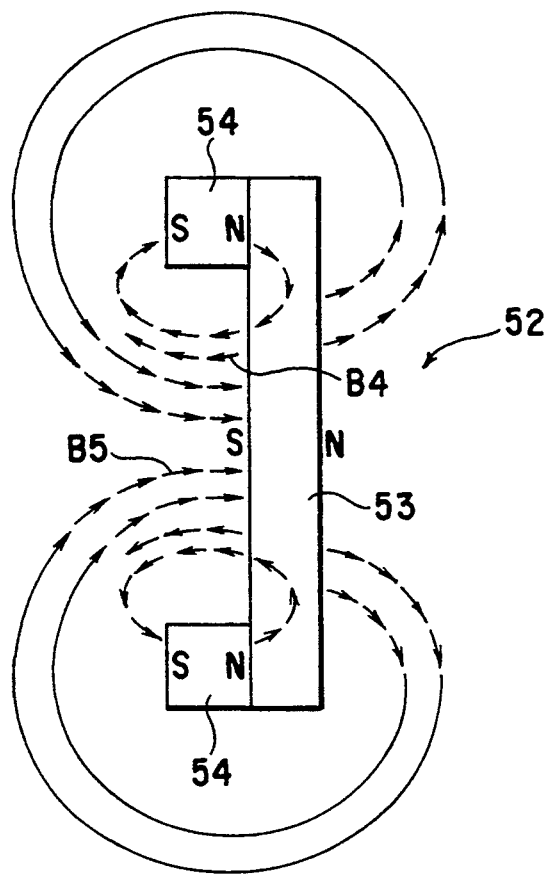
FIG. 8 is a model diagram showing lead-in magnetic lines of force according to a modification.

Instead of using the double electromagnet 40, a bottom permanent magnet 52 may be provided in the wafer holder 6 so as to be situated on the reverse side of the wafer W, as in a modification shown in FIG. 8. The magnet 52 includes a disk-shaped permanent magnet 53 and a ring-shaped permanent magnet 54. The pole orientation of the magnets 53 and 54 is identical with that of the coils 30, 31 and 32 which constitute first magnetic field forming means. In this case, the respective outside diameters of the disk- and ring-shaped magnets 53 and 54 are 10 cm, and the inside diameter of the magnet 54 is 6.8 cm.

The ring-shaped permanent magnet 54, which has a function to draw the scattered magnetic field into the peripheral portion of the wafer W, forms a magnetic field (indicated by a magnetic line of force $B_4$ in FIG. 8) in the direction so as to block the electrons in the vicinity of the wafer W, on the other hand. Thereupon, the disk-shaped permanent magnet 53 is further arranged so that the a magnetic line of force $B_5$ to the line $B_4$ is formed by means of the magnet 53, whereby the line $B_4$ is canceled. Thus, a magnetic field which is shifted to the south- or north-pole side can be prevented from being generated in the vicinity of the wafer W.

Figure 9:
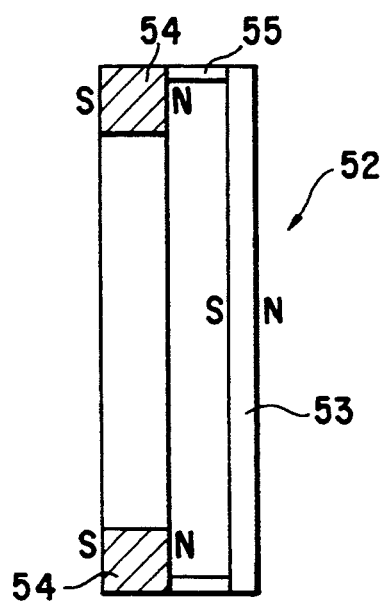
FIG. 9 is a side view showing a lead-in permanent magnet according to another modification.

As in a modification shown in FIG. 9, moreover, a nonmagnetic member 55 may be interposed between the disk- and ring-shaped magnets 53 and 54 so that the magnets 53 and 54 are isolated from each other.

Figure 12:
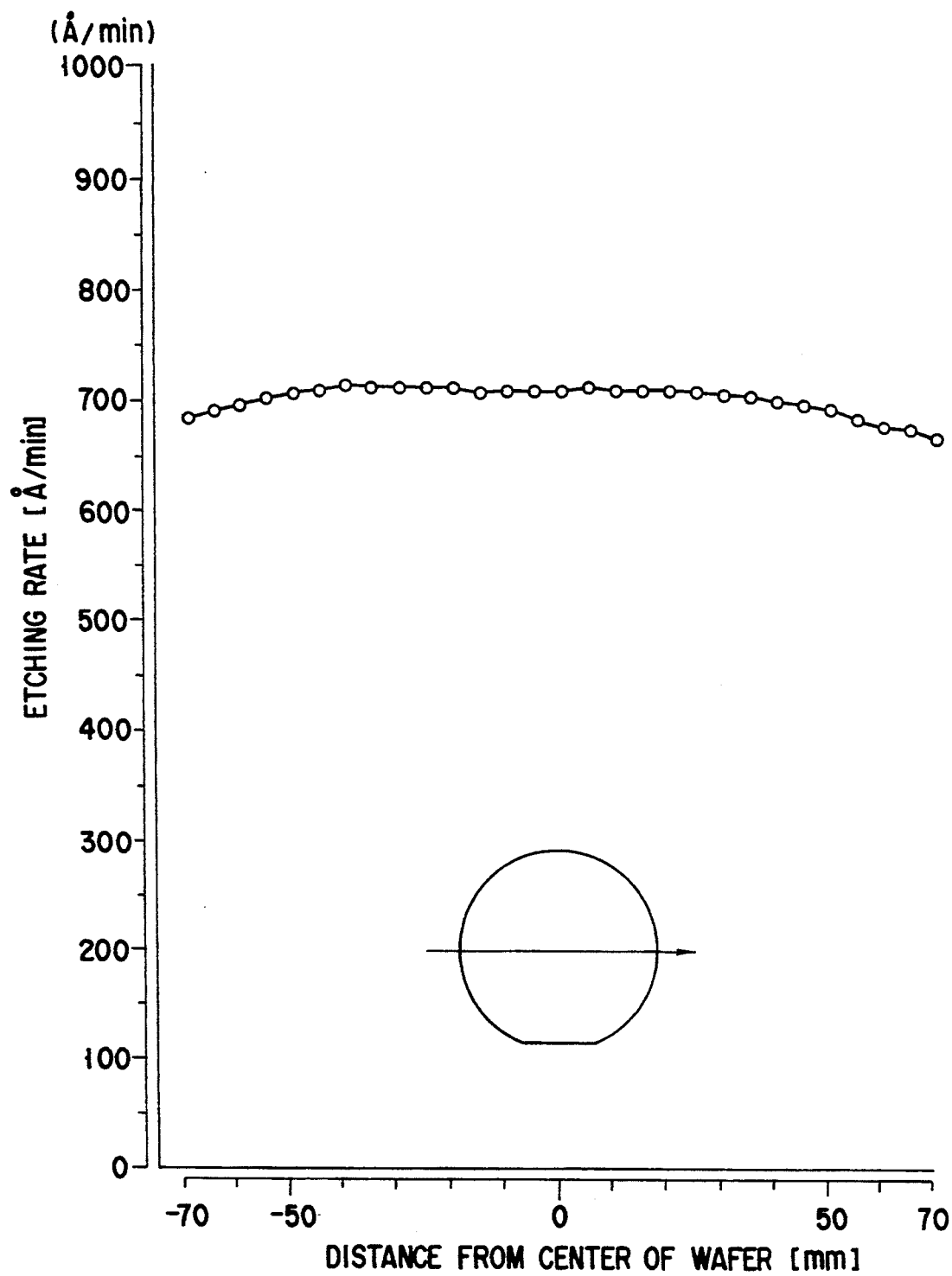
FIG. 12 shows an etching rate distribution curve obtained with use of $SF_6$ gas.

FIG. 12 shows an etching rate distribution curve obtained when $SF_6$ gas is used as an etching gas in the system according to the first embodiment described above. The etching rate was examined under conditions including the $SF_6$ gas flow rate of 5 SCCM, process internal pressure of $1.1 \times 10^{-3}$ torrs, current supply of 9 A to the inner solenoid 38, and current supply of 13 A to the outer solenoid 39. As seen from FIG. 12, the variation of the etching rate was able to be restricted to ±3.4% in the radial range of 70 mm from the center of the wafer.

Figure 13:
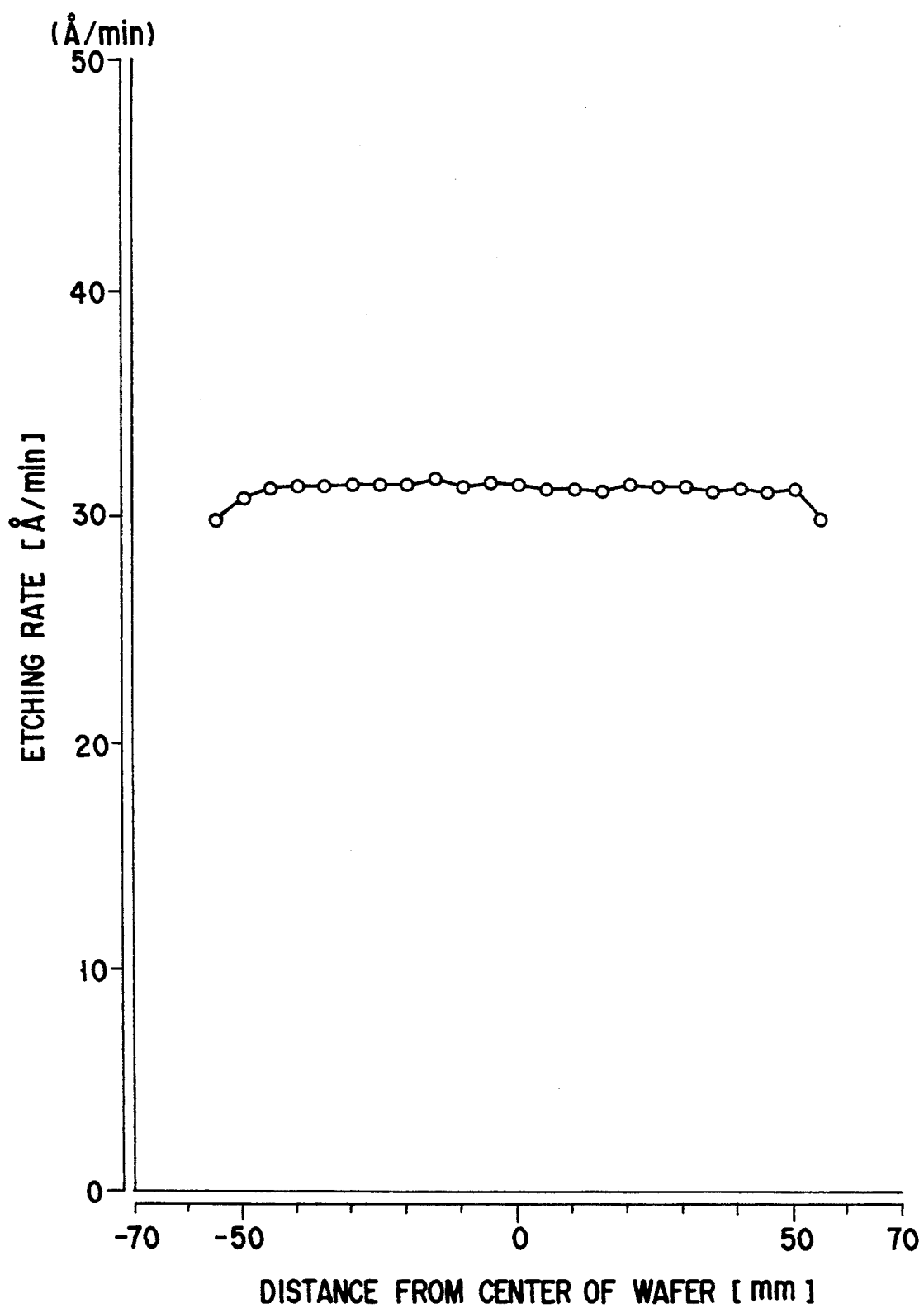
FIG. 13 shows an etching rate distribution curve obtained with use of argon gas.

FIG. 13 shows an etching rate distribution curve obtained when argon gas is used as the etching gas in the system according to the first embodiment. The etching rate was examined under conditions including the argon gas flow rate of 5 SCCM, process internal pressure of $1.1 \times 10^{-3}$ torrs, current supply of 9 A to the inner solenoid 38, and current supply of 13 A to the outer solenoid 39. As seen from FIG. 13, the variation of the etching rate was able to be restricted to ±1.4% in the radial range of 50 mm from the center of the wafer, and to ±3.2% in the radial range of 55 mm. In this case, the etching rate distribution corresponds to the plasma density distribution in the reaction region 16.

FIG. 14 shows characteristic curves illustrating the relationships between the distance of electron transit (axis of abscissa) and electron transmission rate (axis of ordinate), obtained with use of the process internal pressure varying between $1 \times 10^{-4}$ torrs, $3 \times 10^{-4}$ torrs, $5 \times 10^{-4}$ torrs, and $1 \times 10^{-3}$ torrs. As seen from FIG. 14, better results were obtained when the electron beam acceleration region 14 were made shorter. More specifically, the length of the acceleration region 14 should be minimized, preferably to 50±5 mm, so long as no electric discharge is caused between the anode 47 and the accelerating electrode 48.

Referring now to FIGS. 15 to 19, a plasma system according to a second embodiment of the present invention will be described. A description of those portions which are common to the first and second embodiments will not be repeated.

As shown in FIG. 15, the plasma system 60 according to the second embodiment is a horizontal type system. Two coils 64 and 65 are arranged in an electron beam acceleration region 14 of this type system 60. Also, a permanent magnet 75 for scattering high-energy electron beams is provided in a reaction region 16.

Figure 16:
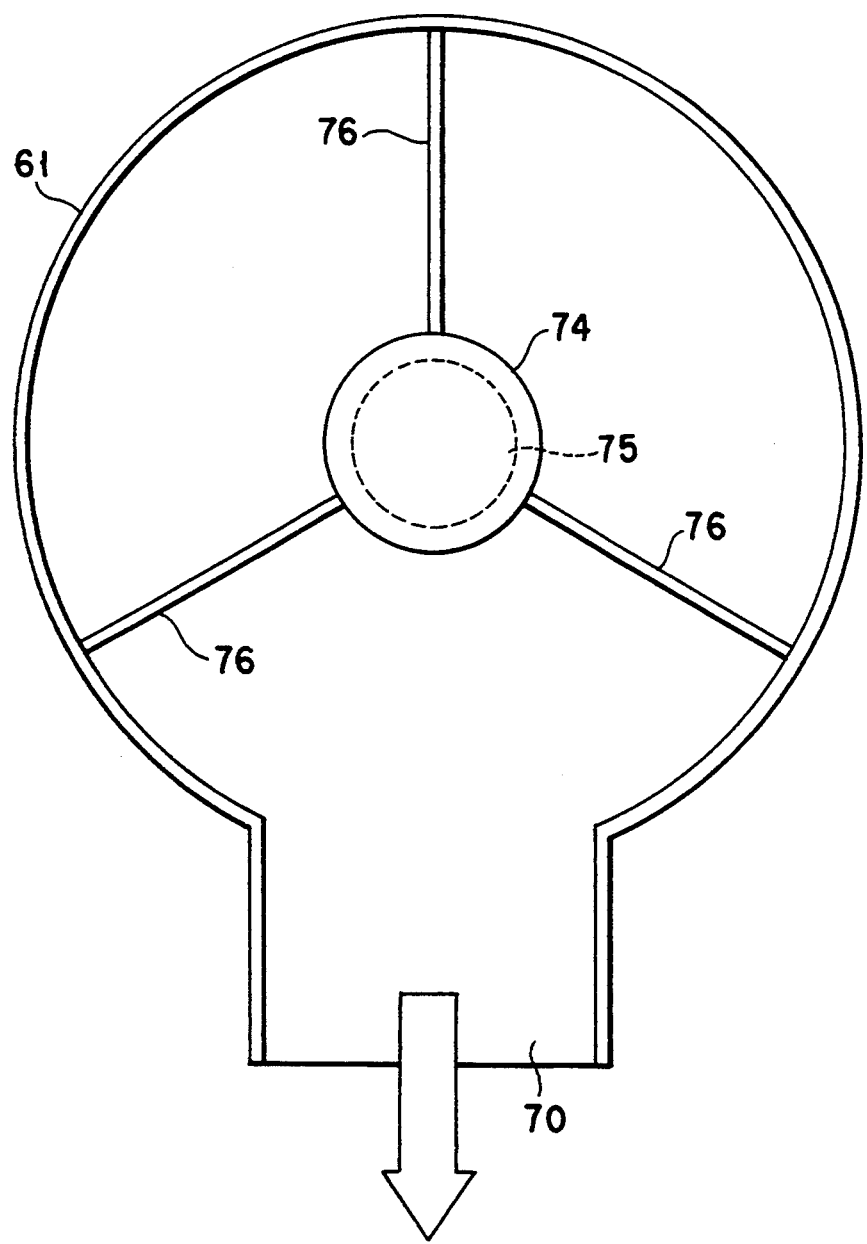
FIG. 16 is a diagram showing a scattering permanent magnet according to the second embodiment.

As shown in FIG. 16, the permanent magnet 75 is disk-shaped, and is contained in a case 74, which is supported on a cylinder unit 61 by means of three support bars 76. An exhaust passage 70 for exhausting the a reaction chamber 26 is formed in the peripheral wall portion of the cylinder unit 61.

The plasma system 60 mainly comprises a plasma generating chamber 24 in which an electric discharge gas is converted into plasma, a coupling portion 25 through which electrons, extracted from the plasma of the discharge gas from the chamber 24 and accelerated, are introduced into the reaction chamber 26, and the chamber 26 in which a semiconductor wafer W is etched by converting the reaction gas into plasma by means of the electrons introduced through the coupling portion 25.

The plasma generating chamber 24, which is a sealed cylindrical container formed of stainless steel or the like, has an inlet port 3 for the introduction of argon gas (electric discharge gas) in the center of one end portion thereof. A conduit which constitutes the port 3 functions as a cathode 2. First and second intermediate electrodes 43 and 44 are arranged so as to be coaxial with the cathode 2. An electron beam passage hole is formed in the central portion of each of the intermediate electrodes 43 and 44. The diameter of the passage hole of the first intermediate electrode 43 can be freely selected, and the degree of vacuum of the space 23 adjustable so that the first discharge gas conversion into plasma can be effected with high efficiency.

The first and second intermediate electrodes 43 and 44 are surrounded by solenoids 30 and 31, respectively. The electrode 43 is 3 mm in diameter and 15 mm in length, while the electrode 44 is 15 mm in diameter and 60 mm in length. The magnetic field formed by the solenoid 31 of the second intermediate electrode 44 has the intensity of 300 gauss. An exhaust passage 27 communicates with a vacuum pump (not shown) by means of an on-off valve (not shown).

An initial discharge region 12, the electron beam acceleration region 14 (coupling portion 25), and the etching region 16 are defined by the cylinder unit 61 which is formed of stainless steel. The solenoids 30 and 31 are each contained in a holder 19, which is set in a suitable portion of the cylinder unit 61. The solenoids 64 and 65 are contained in holders 62 and 63, respectively, which are set individually in suitable portions of the unit 61. O-rings are arranged individually at mounting portions for a cover 4 and the solenoid holders 19, 62 and 63 so that the cylinder unit 61 can be kept airtight inside.

An anode 66 and an electron beam accelerating electrode 67 are arranged at the coupling portion 25 (electron beam acceleration region 14). The anode 66 is connected to the cathode 2 through a discharge circuit 17 so that DC discharge is caused in the chamber 24 when a voltage $V_1$ is applied between the electrodes 2 and 66. The accelerating electrode 67 is connected to the anode 66 through an electron accelerator circuit 18 so that the electrons in the space 25 are accelerated when a voltage $V_2$ is applied between the electrodes 66 and 67. A hole in the anode 66 is 8 mm in diameter and 20 mm in length, while a hole in the electron beam accelerating electrode 67 is 10 in diameter and 20 in length. The respective outside diameters of the solenoids 64 and 65 are 245 mm, and a magnetic field of 400 gauss is formed in the acceleration region 14 by means of these solenoids. The overall length of the cylinder unit 61 ranges from 50 to 60 cm.

As seen from FIG. 14, the length of the coupling portion 25 should be minimized so long as no electric discharge is caused between the anode 66 and the accelerating electrode 67. Preferably, this length is adjusted to 50±5 mm.

A gas passage 71 opens into the reaction chamber 26 so that the etching gas, such as $SF_6$, $Cl_2$, or argon gas, can be fed from a gas source (not shown) into the chamber 26.

The following is a description of dry etching of a silicon wafer W by means of the aforementioned plasma system 60. The electric discharge gas is introduced into the plasma generating chamber 24 through the gas inlet port 3. The gas is discharged through the exhaust passage 27 so that the pressure between the cathode 2 and the first intermediate electrode 43 is 1.0 torr. Electric discharge is caused by applying the discharge voltage $V_1$ between the cathode 2 and each of the first and second intermediate electrodes 43 and 44 and the anode 66. Thereupon, plasma is produced in the spaces 23 and 24. In this case, the plasma discharge can be efficiently achieved by reducing the diameter of the electron beam passage hole of the first intermediate electrode 43 to adjust the internal pressure so that the pressure between the cathode 2 and the intermediate electrode 43 is at 0.6 torr or thereabout. First, electric discharge is caused between the cathode 2 and the first intermediate electrode 43. Subsequently, the discharge advances to the second intermediate electrode 44, and then, to the anode 66. When the electric discharge between the cathode 2 and the anode 66 is stabilized, switches S1 and S2 are turned off to stop the operation of the first and second intermediate electrodes 43 and 44.

At this time, the spaces 26 and 25 are adjusted to an internal pressure of $10^{-6}$ to $10^{-7}$ torrs. The space 25, which has a small capacity, can be fully evacuated by means of a vacuum pump unit which communicates with the exhaust passage 70.

The electrons in the spaces 24 and 25 are accelerated when the acceleration voltage $V_2$ is applied between the electron beam accelerating electrode 67 and the anode 66. Since the length of the space 25 with respect to the electron moving direction is so short that the electrons can be efficiently accelerated and introduced into the reaction chamber 26 even though the solenoids 64 and 65 are increased in diameter.

When the etching gas is introduced into the space 26, thereafter, the accelerated electrons run against the etching gas, thereby producing gas plasma in the space 26. The internal pressure of the space 26 at that time is adjusted to $10^{-3}$ to $10^{-4}$ torrs.

The electrons can efficiently move from the coupling portion 25 to the reaction chamber 26 if inequality (1) holds as follows:

$$P_4 \approx P_3 < P_2, \quad (1)$$

where $P_2$, $P_3$ and $P_4$ are the pressures in the spaces 24, 25 and 26, respectively.

Since ions flow in the direction opposite to the flowing direction of the electrons, the relationship expressed by inequality (1) can be maintained. Accordingly, electrons can be efficiently passed through to the central hole of the electrode 67, as a result, ions in the plasma in the space 26 are accelerated in a plasma sheath on the surface of the wafer W, so that the wafer W can be efficiently etched. Since a surplus of the reaction gas in the space 26 is exhausted by this time, the gas plasma practically does not flow from the space 26 back to the space 25.

In the second embodiment described above, the solenoids 64 and 65 are arranged outside the coupling portion 25 so as to surround the anode 66 and the accelerating electrode 67, respectively. Preferably, these solenoids 64 and 65 should be of the same specifications, and the proper distance between their respective centers should be not shorter than and up to about thrice as long as the average of the inside and outside diameters of the solenoids 64 and 65. If the solenoids 64 and 65 are separately arranged in this manner, the respective magnetic fields of the anode 66 and the electron accelerating electrode 67 can be adjusted independently of each other, so that the amount of inflow of the electrons can be controlled with high efficiency.

Although the plasma generating chamber 24, coupling portion 25, and reaction chamber 26 are formed using the same cylinder unit 61 according to the above-described embodiment, they may alternatively be assembled as independent components.

According to the second embodiment, moreover, the present invention is applied to the electron beam excited dry etching apparatus. However, the invention may be also applied to a plasma system which utilizes plasma for various processes.

Figure 17:
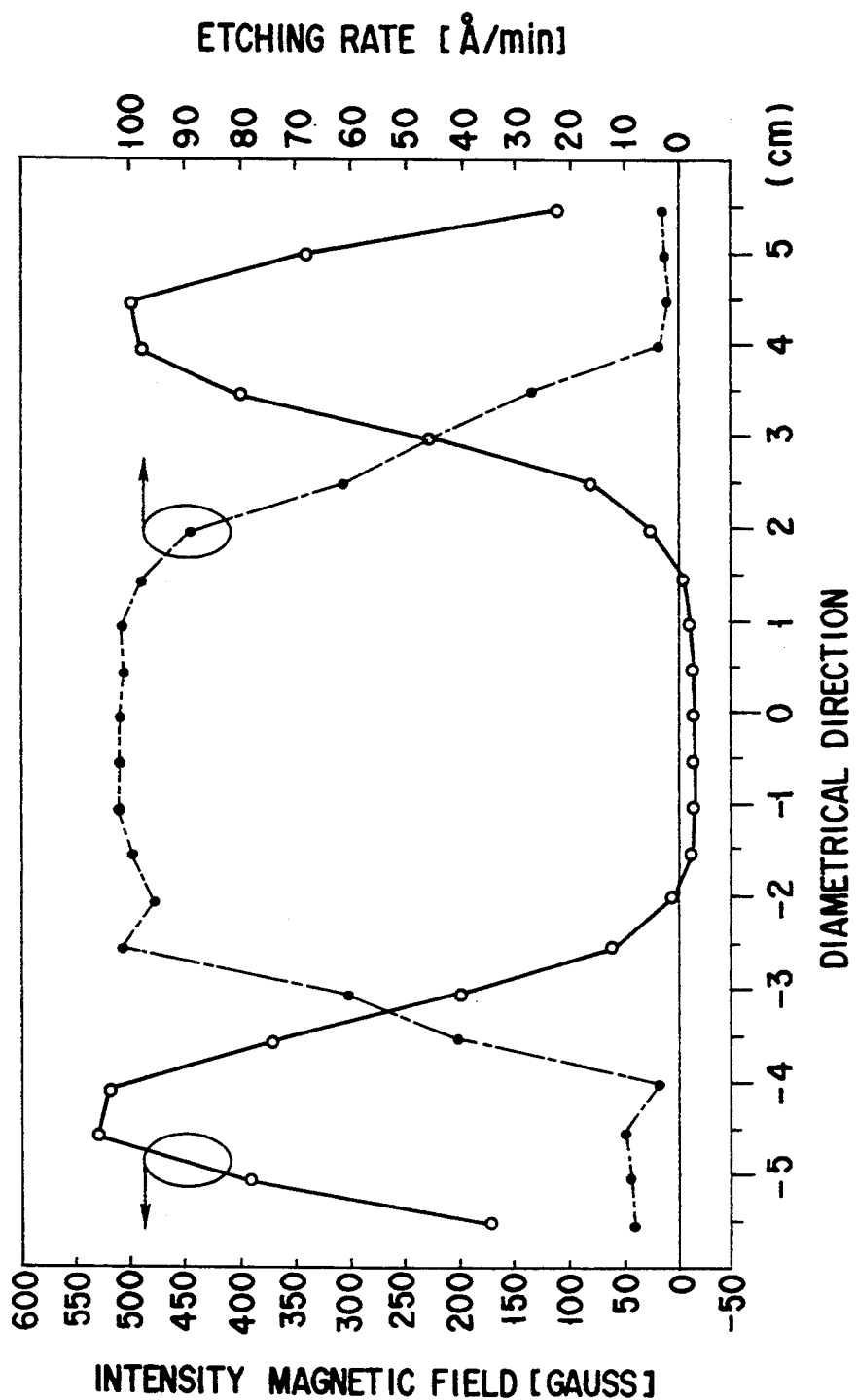
FIG. 17 shows distribution curves for the magnetic field intensity and etching rate.

FIG. 17 shows the magnetic field intensity distribution and etching rate distribution on a target surface observed when the wafer W is etched by means of the system according to the aforementioned embodiment. These experimental data were measured under the various conditions as follows:

| | |
|---|---|
| Outside diameter of solenoids 64 and 65: | 10 cm, |
| Inside diameter of solenoids 64 and 65: | 6.8 cm, |
| Distance from target surface to left-hand side face of scattering magnet 75: | 6 cm, |
| Distance from target surface to center line of solenoid 65: | 43 cm, |
| Etched layer (top layer) of wafer W: | Polycrystalline silicon, |
| Intermediate layer of wafer W: | $SiO_2$, |
| Bottom layer of wafer W: | Single-crystal silicon. |

In the vicinity of the center, as seen from FIG. 17, the magnetic field distribution is substantially uniform, and the field intensity is nearly zero. In the region surrounding the uniform field region, the magnetic field intensity suddenly rises with distance from the center, and the cylindrical magnetic field region of high intensity is formed in the manner as aforesaid. The plasma can be confined to the high-intensity region thus secured around the uniform magnetic field region. The ions of the reaction gas plasma diffuse into the cylindrical plasma region. Thus, a high ion-current density can be obtained with use of relatively small energy of electrons in a region which faces the central nonmagnetic region. The wafer W is etched by sputtering these ion, whereby the polycrystalline silicon of the etched layer on the wafer W is etched. As seen from the etching rate distribution of FIG. 17, a substantially uniform spactter etching rate of 100 angstroms per minute was able to be secured in the nonmagnetic region inside the high-intensity cylindrical plasma region.

As an alternative embodiment of the present invention, the all magnetic fields of the solenoids 30, 31, 64 and 65, which constitute the first magnetic field forming means, may be reversed in direction. In this case, the electron beam is guided by the first magnetic field, which is formed by means of the coils 30, 31, 64 and 65, and reaches the region facing the scattered magnetic field in a manner such that it is converged, whereupon it is scattered outward from the center.

Thereafter, the scattered electron beam is drawn in to the peripheral portion of the wafer W by the third magnetic field, so that the reaction gas is activated, and high-density plasma is produced around the object of processing. The third magnetic field can produce uniform gas plasma which is bound less firmly to the magnetic field as a fourth magnetic field is used to provide a magnetic field intensity distribution such that the field intensity in the region facing the wafer W is as close to zero as possible.

COMPARATIVE SYSTEM

FIG. 18 shows a characteristic curve representing magnetic flux density measured with respect to the diametrical direction of the wafer W under the following conditions. In place of using a double coil 40, in this measurement, the ring-shaped permanent magnet 54 shown in FIG. 8 is mounted in the system 60, and the other conditions are used without change. In the central region with respect to the diametrical direction, as seen from FIG. 18, the magnetic field intensity distribution is substantially uniform, as in the case of the characteristic curve of FIG. 17 for the foregoing embodiment. However, the magnetic field in the central region is considerably shifted to the south-pole side. It can be believed, therefore, that the plasma density distribution is also one-sided in the central region with respect to the diametrical direction. This is more apparent from the etching rate distribution shown in FIG. 19.

Figure 19:
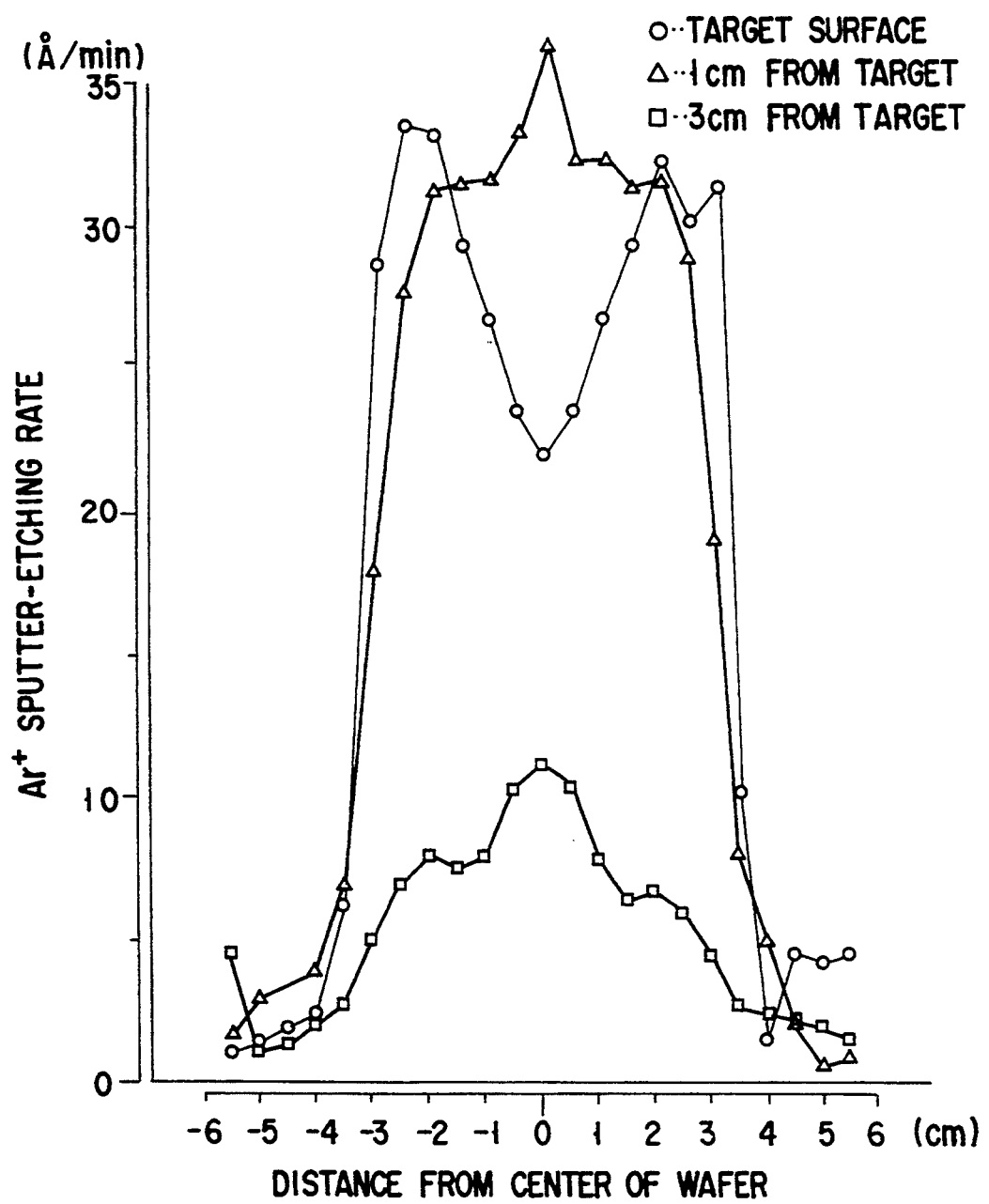
FIG. 19 shows etching rate distribution curves according to the comparative system.

FIG. 19 shows distribution curves representing etching rates measured individually on the target surface and in positions at distances of 1 cm and 3 cm from the target surface, in this comparative system. As seen from FIG. 19, the etching rate in the central area for each case rises or falls to an extreme in the vicinity of the center, so that its uniformity is very low. This is supposed to be attributable to the inclination of plasma density in the central region with respect to the diametrical direction. According to the present embodiment, in contrast with this, the magnetic field intensity distribution in the central region of the wafer surface with respect to the diametrical direction is substantially uniform, and a substantially nonmagnetic state is established in this region, so that the in-plane uniformity of the etching rate is improved.

Figure 20:
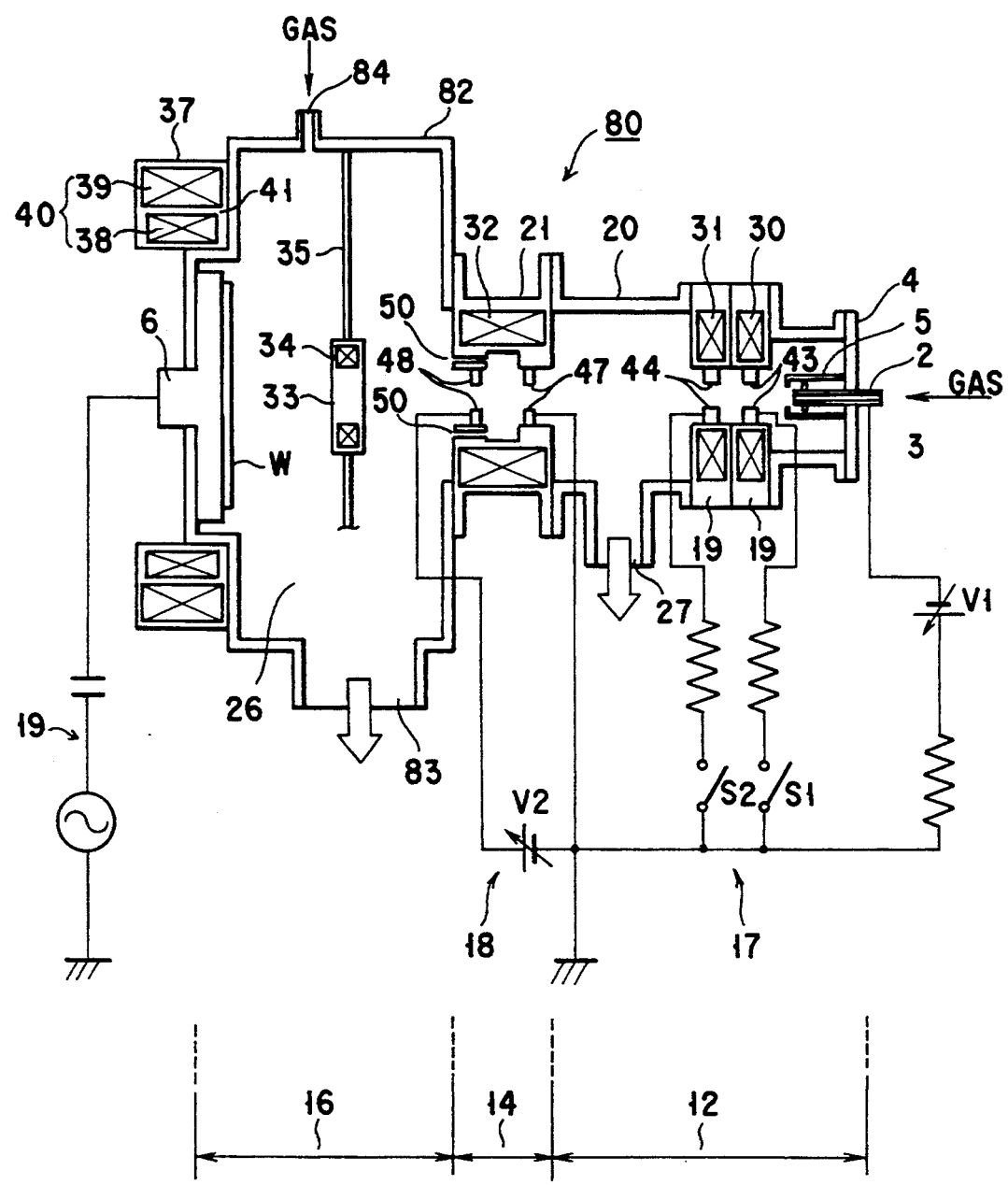
FIG. 20 is a vertical sectional view showing an outline of an electron beam excited plasma system according to a third embodiment.

Referring now to FIG. 20, a system 80 according to a third embodiment of the present invention will be described. A description of those portions which are common to the first to third embodiments will not be repeated. The plasma system 80 according to the third embodiment is a horizontal type system. One coil 32 is arranged in an electron beam acceleration region 14 of this system 80. Two electrodes 47 and 48 are surrounded by the coil 32. Also, a magnetic coil 34 for scattering high-energy electron beams is provided in a reaction region 16. Cylinder units 20, 21 and 82, which are arranged corresponding to regions 12, 14 and 16, respectively, are airtightly connected to one another. A space 26 is defined by the cylinder unit 82, and a gas supply passage 84 and an exhaust passage 83 open into the space 26. The passage 84 communicates with an etching gas source (not shown).

Figure 21:
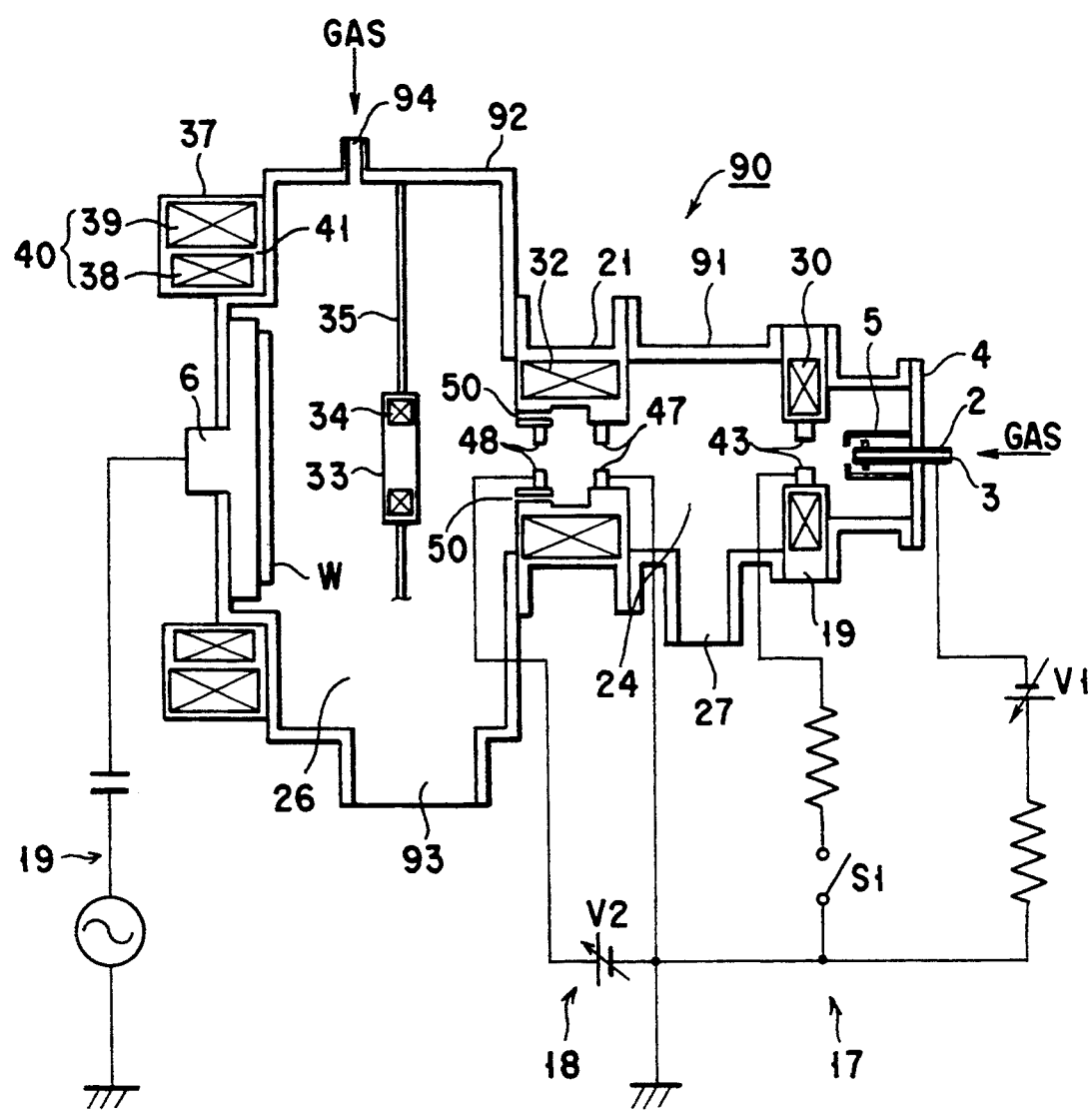
FIG. 21 is a vertical sectional view showing an outline of an electron beam excited plasma system according to a fourth embodiment.

Referring now to FIG. 21, a system 90 according to a fourth embodiment of the present invention will be described. A description of those portions which are common to the first to fourth embodiments will not be repeated. The plasma system 90 according to the fourth embodiment is a horizontal type system. Only one intermediate electrode 30 is provided in an initial discharge region 12 of the system 90. One coil 32 is arranged in an electron beam acceleration region 14. Two electrodes 47 and 48 are surrounded by the coil 32. Cylinder units 20, 21 and 92, which are arranged corresponding to regions 12, 14 and 16, respectively, are airtightly connected to one another. A space 26 is defined by the cylinder unit 92, and a gas supply passage 94 and an exhaust passage 93 open into the space 26.

Figure 22:
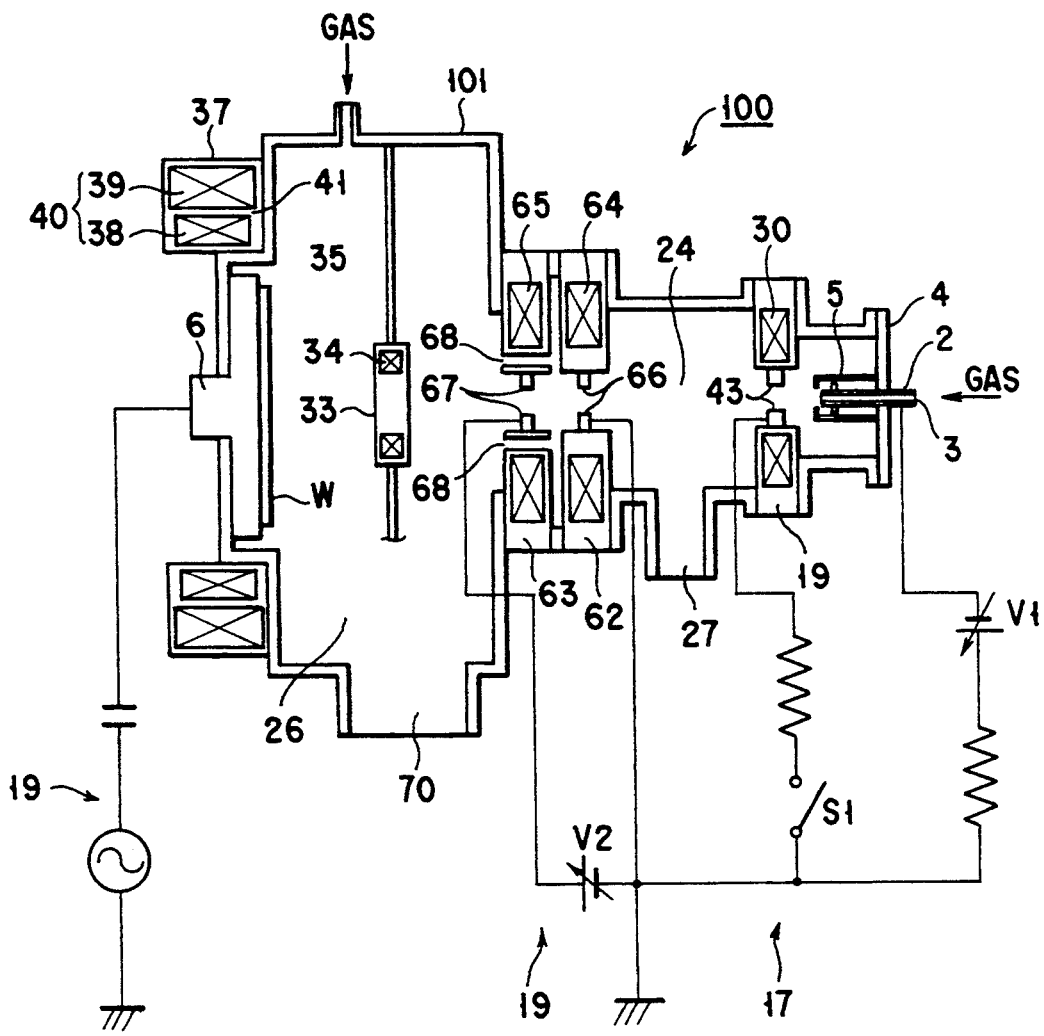
FIG. 22 is a vertical sectional view showing an outline of an electron beam excited plasma system according to a fifth embodiment.

Referring now to FIG. 22, a system 100 according to a fifth embodiment of the present invention will be described. A description of those portions which are common to the first to fifth embodiments will not be repeated. The plasma system 100 according to the fifth embodiment is a horizontal type system. Only one intermediate electrode 30 is provided in an initial discharge region 12 of the system 100. Two coils 64 and 65 are arranged in an electron beam acceleration region 14. Electrodes 66 and 67 are surrounded by the coils 64 and 65, respectively.

According to the fourth and fifth embodiments described above, the intermediate electrode 30 used is only one in number, so that the system has a simpler construction and smaller size.

According to the electron beam excited plasma system of the present invention described herein, the etching rate for the wafer W can be made uniform by arranging the magnetic field intensity distribution of the region facing the wafer W so that the wafer W is surrounded by an outside magnetic field of relatively high intensity and its surface region is substantially nonmagnetic.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electron beam excited plasma system in which an electron beam is extracted from a discharge plasma and accelerated, the accelerated electrons are applied to a process gas to convert the process gas into a gas plasma, and the resulting gas plasma is caused to act on a semiconductor wafer disposed on a support surface of a wafer holder, comprising:

first gas supply means for supplying a gas, which is used to generate the discharge plasma, to a region between a cathode and an anode;

first magnetic field forming means for forming a first magnetic field substantially parallel to the direction of the electron beam such that the electron beam is guided along a center line connecting an axis of the cathode and a central axis of the wafer holder;

an accelerating electrode surrounded by the first magnetic field forming means and adapted to accelerate the electron beam when a voltage is applied between the accelerating electrode and the anode;

second magnetic field forming means opposed to the support surface of the wafer holder for forming a second magnetic field opposite in polarity to the first magnetic field and for spreading said first magnetic field outward from said the center line;

third magnetic field forming means for forming a third magnetic field having the same polarity as said first magnetic field to draw the first magnetic field spread by the second magnetic field to a peripheral portion of the wafer holder;

second gas supply means for supplying the process gas to be converted into the gas plasma by means of the electron beam to a region around the wafer holder; and exhaust means for evacuating the region around the wafer.

2. An electron beam excited plasma system according to claim 1, wherein said first magnetic field forming means includes a plurality of solenoids, one of the solenoids coaxially surrounding both the anode and the accelerating electrode.

3. An electron beam excited plasma system according to claim 1, wherein said first magnetic field forming means includes a plurality of solenoids, one of the solenoids coaxially surrounding the anode, and another solenoid coaxially surrounding the accelerating electrode.

4. An electron beam excited plasma system according to claim 1, further comprising an intermediate electrode or electrodes located between the cathode and the anode.

5. An electron beam excited plasma system according to claim 4, wherein said intermediate electrodes are two in number, and each said intermediate electrode is coaxially surrounded by a solenoid.

6. An electron beam excited plasma system according to claim 4, wherein said intermediate electrode is one in number, and is coaxially surrounded by a solenoid.

7. An electron beam excited plasma system according to claim 1, wherein said cathode has a passage therein, and said gas for the generation of the discharge plasma is supplied from the first gas supply means through the passage.

8. An electron beam excited plasma system according to claim 1, further comprising fourth magnetic field forming means for forming a magnetic field in the direction identical with or opposite to the advancing direction of the electron beam in order to cancel the magnetic field formed by means of the third magnetic field forming means.

9. An electron beam excited plasma system according to claim 8, wherein said third magnetic field forming means is a ring-shaped electromagnet or permanent magnet arranged parallel to the support surface of the wafer holder and having magnetic poles oriented in the same direction as those of the first magnetic field forming means, and said fourth magnetic field forming means is a disk-shaped permanent magnet arranged parallel to the third magnetic field forming means and having magnetic poles oriented in the same direction as those of the first magnetic field forming means.

10. An electron beam excited plasma system according to claim 8, wherein said third and fourth magnetic field forming means include a plurality of ring-shaped electromagnets with different diameters arranged in coaxial relation.

11. An electron beam excited plasma system in which electrons are extracted from a discharge plasma and accelerated, the accelerated electrons are applied to a process gas to convert the process gas into plasma, and the resulting gas plasma is caused to act on a semiconductor wafer disposed on a support surface of a wafer holder, comprising:

a plasma generating chamber having a cathode and an anode for generating the discharge plasma;

first gas supply means for supplying a gas, which is used to generate the discharge plasma, to the plasma generating chamber;

second gas supply means for supplying the process gas to be converted into the gas plasma by means of the electron beam to a region in the vicinity of the support surface of the wafer holder;

exhaust means for evacuating the region around the support surface of the wafer holder;

a reaction chamber in which the process gas is converted into plasma for wafer processing and applying the electrons extracted from the discharge plasma;

a coupling portion located between the plasma generating chamber and the reaction chamber;

an electron beam accelerating electrode located between the coupling portion and the reaction chamber and having a center hole through which the electrons pass; and a plurality of communication passages formed in the electron beam accelerating electrode so as to surround the center hole and communicating with the reaction chamber and the coupling portion.

12. An electron beam excited plasma system according to claim 11, further comprising an intermediate electrode or electrodes located between the cathode and the anode.

13. An electron beam excited plasma system according to claim 12, wherein said intermediate electrodes are two in number, and each said intermediate electrode is coaxially surrounded by a solenoid.

14. An electron beam excited plasma system according to claim 12, wherein said intermediate electrode is one in number, and is coaxially surrounded by a solenoid.

15. An electron beam excited plasma system according to claim 11, further comprising a solenoid coaxially surrounding both the anode and the accelerating electrode.

16. An electron beam excited plasma system according to claim 11, further comprising a first solenoid coaxially surrounding the anode and a second solenoid coaxially surrounding the accelerating electrode.

17. An electron beam excited plasma system according to claim 11, wherein an inlet passage is formed in the cathode, and said gas is supplied from the first gas supply means to the plasma generating chamber via said inlet passage.

18. An electron beam excited plasma system according to claim 11, wherein the communication passage has a diameter of 3.0 to 4.0 mm.

19. An electron beam excited plasma system according to claim 11, wherein 6 to 10 communication passages are provided.

20. An electron beam excited plasma system according to claim 11, wherein the region including the electron beam accelerating electrode is 50±5 mm long.

* * * * *